United States Patent [19]

Dobrovolny

[11] Patent Number: 5,311,318
[45] Date of Patent: May 10, 1994

[54] DOUBLE CONVERSION DIGITAL TUNING SYSTEM USING SEPARATE DIGITAL NUMBERS FOR CONTROLLING THE LOCAL OSCILLATORS

[75] Inventor: Pierre Dobrovolny, North Riverside, Ill.

[73] Assignee: Zenith Electronics Corporation, Glenview, Ill.

[21] Appl. No.: 931,172

[22] Filed: Aug. 17, 1992

[51] Int. Cl.$^5$ .............................................. H04N 5/50
[52] U.S. Cl. .................. 348/731; 455/164.2; 455/182.3; 331/16; 348/735
[58] Field of Search ............... 358/191.1, 193.1, 195.1; 455/316, 161.2, 164.2, 173.1, 180.3, 182.3, 183.2, 192.2, 192.3, 197.1; 331/11, 16; 334/13, 16; H04N 5/50

[56] References Cited

U.S. PATENT DOCUMENTS

| | | | |
|---|---|---|---|
| 4,374,437 | 2/1983 | Citta et al. | 358/193.1 |
| 4,551,856 | 11/1985 | Victor et al. | 455/316 |
| 4,575,761 | 3/1986 | Carlson et al. | 455/182.3 |
| 4,727,591 | 2/1988 | Manlove | 455/164.2 |
| 4,817,195 | 3/1989 | Kubo et al. | 455/192 |
| 5,132,799 | 7/1992 | Gakumura | 358/191.1 |

Primary Examiner—James J. Groody
Assistant Examiner—Glenton B. Burgess

[57] ABSTRACT

A double conversion tuning system for a high definition television receiver includes a microprocessor supplying first and second digital numbers to first and second local oscillators. The first local oscillator is controlled by a wide band phase locked loop that includes a programmable divider that receives the first digital number from the microprocessor and a prescaler that couples the first local oscillator signal to the programmable divider. The output of the programmable divider supplies one input of a phase detector, the other input of which is supplied with the divided down output of a crystal reference source. The output of the phase detector controls the first local oscillator frequency. The tuning of the first local oscillator is coarse and the first IF signal frequency may deviate within a predetermined range from a desired value. The second digital number from the microprocessor controls, via a D/A and varactor, the resonant frequency of a tunable dielectric resonator in the second local oscillator to adjust the second local oscillator frequency to compensate for the deviation in first IF signal frequency so that the second IF signal frequency remains constant.

7 Claims, 1 Drawing Sheet

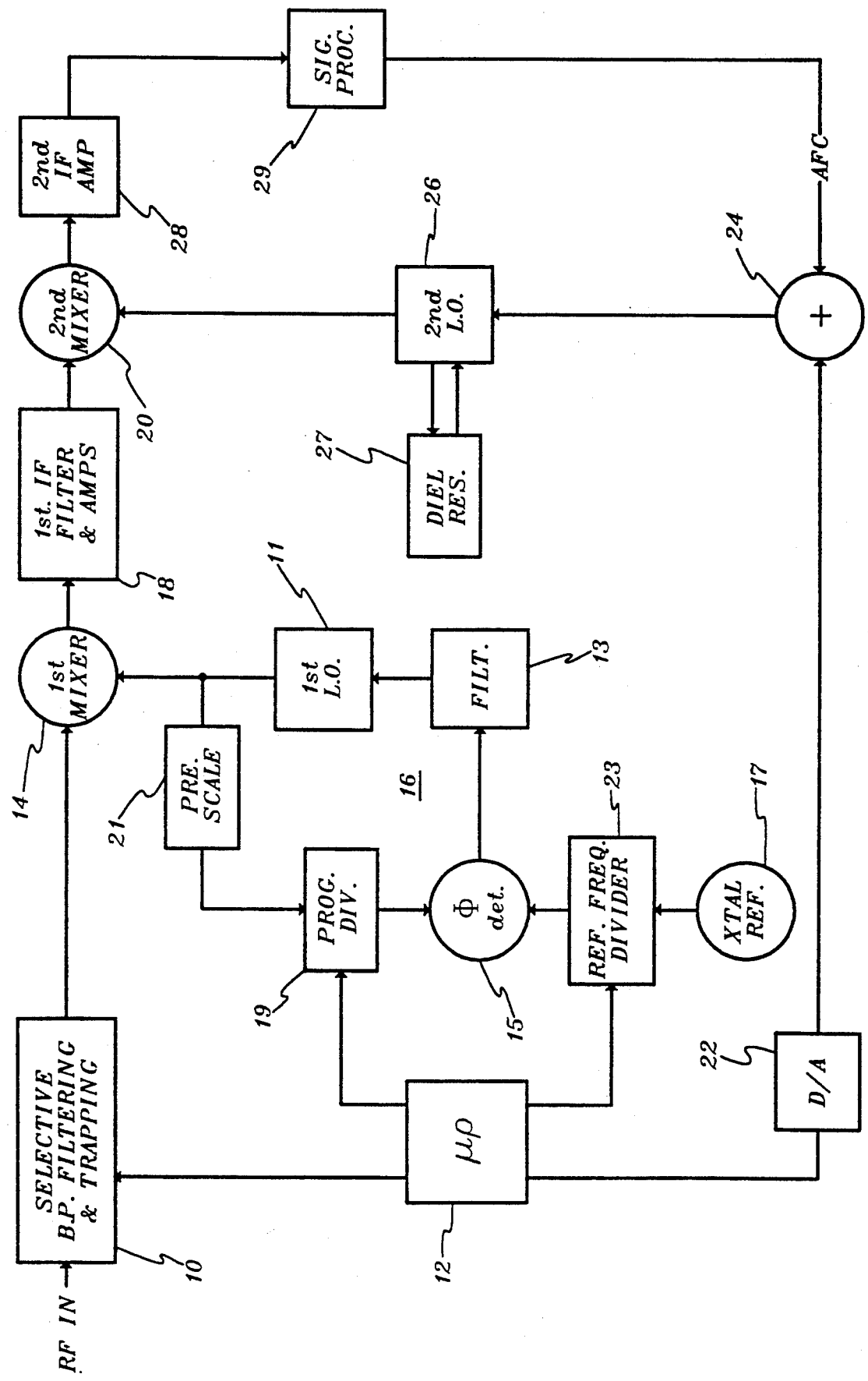

DOUBLE CONVERSION DIGITAL TUNING SYSTEM USING SEPARATE DIGITAL NUMBERS FOR CONTROLLING THE LOCAL OSCILLATORS

CROSS REFERENCE TO RELATED APPLICATIONS

This application is related to, but not dependent upon, copending application Ser. No. 815,721, filed Dec. 30 1991, entitled BANDSWITCHED TUNING SYSTEM FOR A DIGITAL TELEVISION RECEIVER.

BACKGROUND OF THE INVENTION AND PRIOR ART

This invention relates generally to double conversion television tuning systems and in particular to a double conversion tuning system for use with digital television (TV) signals.

The recently proposed Zenith/AT&T Digital Spectrum Compatible High Definition Television System (DSC/HDTV) transmits wide band television information that is digitally encoded. Processing of the digital information imposes severe restrictions on the amount of phase noise that may be tolerated in the tuning system. It is critical that the tuning system impose a minimal amount of phase noise on the digital information which, lacking the redundancy of conventional television signals, demands accurate detection and decoding. A double conversion type tuning system appears to be the most desirable for digital HDTV signals, although conventional NTSC double conversion tuning systems do not exhibit sufficiently low phase noise characteristics to be entirely satisfactory. This is due to both the low "Q" of the varactor diode-tuned tank circuit in the first local oscillator of the double conversion tuning stage and the narrow band phase locked loop (PLL) of the synthesizer. The arrangement of copending application Ser. No. 815,721 above remedies the first part of the problem, i.e. low Q of the tuned circuits. The latter part of the problem is the subject of the present invention. Thus the present invention describes a double conversion tuning system that meets both the criteria of low phase noise and tuning accuracy.

OBJECTS OF THE INVENTION

A principal object of the invention is to provide an improved double conversion television signal tuning system.

Another object of the invention is to provide a double conversion television tuning system that exhibits low phase noise.

A further object of the invention is to provide a double conversion tuning system suitable for use with digital television signals.

BRIEF DESCRIPTION OF THE DRAWINGS

These and other objects and advantages of the invention will be apparent upon reading the following description in conjunction with the drawing, the single figure of which is a partial block diagram illustrating a double conversion television signal tuner constructed in accordance with the invention.

DESCRIPTION OF THE PREFERRED EMBODIMENT

Referring to the figure, an RF input signal, which may comprise either an over-the-air or a cable-connected television signal in the VHF-UHF frequency range of 50 MHz to 800 MHz, is applied to an input terminal. In accordance with the disclosure in the above mentioned copending application Ser. No. D6613, a selective bandpass filtering and trapping network is provided for enhancing the tuned signal, i.e. minimizing interferences from other signals. The selective filtering circuit is controlled by a microprocessor 12 which also controls tuning of the tuning system and other functions of the receiver that are not relevant to this invention. The output of the selective filter 10 is coupled to a first mixer 14 that is supplied with a signal from a first local oscillator 11 which is part of a phase locked loop 16. A first IF signal is developed and applied to a first IF filter and amplifier 18, the output of which is applied to a second mixer 20. The output of a second local oscillator 26 is applied to second mixer 20 and is heterodyned with the first IF signal to produce a second IF signal of fixed frequency, which is applied to a second IF amplifier 28. A dielectric resonator 27 comprises the tank circuit of second local oscillator 26. The output of second IF amplifier 28 is supplied to a signal processing circuit 29 which should be understood to include the remainder of the television signal processing circuitry. Processing circuit 29 develops an AFC signal which is applied to an adder 24, the output of which controls, via properly coupled varactors (not shown), the resonant frequency of dielectric resonator 27, which in turn controls the frequency of the second local oscillator 26. It will be appreciated that other frequency controllable elements such as a SAW resonator may be used in place of dielectric resonator 27. The other input of adder 24 is supplied from microprocessor 12 through a digital-to-analog converter (D/A) 22. The phase locked loop 16 for controlling the first local oscillator signal includes a filter 13, a phase detector 15, a crystal controlled reference oscillator 17, a programmable divider 19 and a prescaler 21. Microprocessor 12 supplies a first digital number to programmable divider 19 that is related to the RF channel signal to be tuned. Divider 19, in conjunction with prescaler 21, develops an input to phase detector 15 that is representative of the frequency of first local oscillator 11 for comparison with a divided down reference signal. Crystal controlled reference oscillator 17 supplies a reference signal to a reference frequency divider 23 which provides the divided down reference signal to phase detector 15. Reference frequency divider 23 is also controlled by microprocessor 12, i.e. microprocessor 12 supplies a digital number to frequency divider 23 that is related to the RF signal to be tuned. The output of phase detector 15 is applied through a filter 13 for controlling the frequency of first local oscillator 11.

In accordance with the invention, phase locked loop 16 is designed to exhibit very low phase noise. To produce a low phase noise characteristic, a relatively large reference frequency is desirable. This makes it possible to increase the bandwidth of the phase locked loop and thus "clean" a wider frequency band of the first local oscillator noisy spectrum. The difficulty is that a large reference frequency for the first local oscillator results in tuning steps of almost 1 MHz, which are quite coarse. This coarse synthesizer resolution may be conventionally increased by using multiple loop synthesizers. However, such an approach, while justifiable for expensive test equipment, is out of the question for a television receiver tuner. In practice, the tuning system develops a first IF signal frequency that may deviate by ± ½ MHz from the desired first IF signal frequency. In the embodiment chosen for the purposes of description, the desired first IF signal frequency is 920 MHz and with the low phase noise phase locked loop system of the invention, the deviation in first IF signal frequency is within ½ MHz of 920 MHz. It will be appreciated that for some channels, the deviation may be less than ½ MHz. Also the system could be designed to accommodate a different maximum deviation.

A ± ½ MHz deviation in the first IF signal frequency is not acceptable with a fixed frequency second local oscillator downconverter. In the digital receiver, the second IF frequency must be maintained very close to 44 MHz. (The pull in range of the whole receiver is about ± 100 KHz.) In accordance with the invention, two look-up tables are provided for channel tuning. One look-up table contains a first digital number to apply to programmable divider 19 for coarsely controlling the desired one of the incoming RF television signal frequencies and the other look-up table contains a second digital number to be applied to D/A converter 22 for fine controlling the frequency of the second local oscillator to compensate for the (known) deviation in the first IF signal frequency. The result is that the second IF signal frequency is constant at 44 MHz despite the deviation in the first IF signal frequency.

Assume, for purposes of illustration, that a 100 MHz RF input signal is to be tuned. To produce a nominal 920 MHz first IF signal frequency, a first local oscillator signal of 1020 MHz is required. Downconversion to a 44 MHz second IF signal frequency requires a second local oscillator signal frequency of 920−44=876 MHz. Assume that the crystal reference and programmable divider used result in the first local oscillator signal frequency of 1020.5 MHz rather than 1020 MHz. The look-up tables accessed by the microprocessor would contain the first number for the programmable divider and the second number for the D/A 22. The second number would produce a voltage to adjust the second local oscillator signal frequency to compensate sufficiently for the fact that the first local oscillator signal frequency is ½ MHz higher than desired and has resulted in a first IF signal frequency that is also ½ MHz higher than the desired first IF signal frequency, i.e. 920.5 MHz rather than 920 MHz. The second local oscillator signal frequency, instead of being 876 MHz, is adjusted to 876.5 MHz. The adjustment results in the second IF signal frequency of 44 MHz. The provision of an AFC voltage to adder 24 is not required but may be useful for certain types of processing circuits 29.

Thus, with the invention, a single low noise wide band phase locked loop may be used for the first local oscillator in the double conversion tuner and deviations in the first IF signal frequency due to the relatively low resolution of the first local oscillator are compensated by increasing the resolution of the second local oscillator to maintain a second IF signal frequency of 44 MHz. It is recognized that numerous changes in the described embodiment of the invention will occur to those skilled in the art without departing from its true spirit and scope. The invention is to be limited only as defined in the claims.

What is claimed is:

1. A method of double converting a digital RF signal to a fixed second IF signal frequency based upon the RF signal channel number comprising:
   generating a first digital number;
   supplying said first digital number to a low noise phase locked loop for controlling the frequency of a first local oscillator signal;
   supplying a first mixer with said digital RF signal and said first local oscillator signal for generating a first IF signal frequency; and
   generating a second digital number;
   using said second digital number to control the frequency of a second local oscillator signal, said second digital number compensating the frequency of said second local oscillator signal for any deviation of said first IF signal frequency from a predetermined value.

2. A method of tuning a digital RF channel signal comprising:
   first converting said RF channel signal to a nominal first IF signal frequency with a first local oscillator signal that is controlled by a phase locked loop exhibiting low phase noise, said first converting comprising supplying an RF channel related digital number from a microprocessor to a programmable divider that is supplied with a first local oscillator signal and using the output of the programmable divider as one input to a phase detector that is supplied with a reference frequency; and
   second converting said nominal first IF signal frequency to a second fixed IF signal frequency with a second local oscillator signal having a frequency that is compensated for deviations in said nominal first IF signal frequency, said second converting comprising supplying another channel related number from the microprocessor for controlling the frequency of the second local oscillator.

3. The method of claim 2 wherein said second local oscillator includes a tunable resonator for controlling its frequency.

4. A double conversion tuning system for an RF signal comprising:
   first and second mixers for generating first and second IF signals, respectively;
   first and second local oscillators coupled to said first and second mixers, respectively;
   a low phase noise phase locked loop controlling the frequency of said first local oscillator;
   microprocessor means supplying a first digital number to said phase locked loop, said first mixer generating said first IF signal within a predetermined frequency deviation of a desired first IF frequency; and
   said microprocessor means supplying a second digital number to said second local oscillator for adjusting the frequency of said second local oscillator to compensate for the deviation of the frequency of said first IF signal from said desired first IF frequency.

5. The tuning system of claim 4 wherein said phase locked loop includes a prescaler coupled to receive said first local oscillator frequency, and further including:
   a programmable divider receiving an input from said prescaler and from said microprocessor means;
   a crystal controlled reference frequency source; and
   a phase detector having inputs coupled to the output of said programmable divider and to said reference frequency source and an output coupled to said first local oscillator.

6. The tuning system of claim 5 wherein said second local oscillator signal includes resonator means.

7. The tuning system of claim 6 wherein said microprocessor means is provided with look-up tables for determining said first and second numbers for each said HDTV RF signal.

* * * * *